United States Patent
Huang et al.

(10) Patent No.: US 7,834,389 B2
(45) Date of Patent: Nov. 16, 2010

(54) TRIANGULAR SPACE ELEMENT FOR SEMICONDUCTOR DEVICE

(75) Inventors: Yu-Lien Huang, Jhubei (TW); Yi-Chen Huang, Hsin Chu (TW); Jim Cy Huang, Bao-Shan Township, Hsin-Chu County (TW); Weng Chang, Hsin-Chu (TW); Hun-Jan Tao, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 609 days.

(21) Appl. No.: 11/763,566

(22) Filed: Jun. 15, 2007

(65) Prior Publication Data

US 2008/0308899 A1    Dec. 18, 2008

(51) Int. Cl.
*H01L 29/788* (2006.01)

(52) U.S. Cl. .............. 257/316; 257/321; 257/318; 257/E21.64; 257/E21.641; 438/231; 438/595; 438/981

(58) Field of Classification Search ......... 257/316–321, 257/E21.64, 21.641; 438/231, 595, 981
See application file for complete search history.

(56) References Cited

U.S. PATENT DOCUMENTS

| | | | |
|---|---|---|---|
| 6,210,997 B1 * | 4/2001 | Adachi et al. | 438/151 |
| 6,448,142 B1 | 9/2002 | Lai et al. | |
| 6,455,388 B1 | 9/2002 | Lai et al. | |
| 6,524,919 B2 | 2/2003 | Lai et al. | |
| 2007/0001233 A1 * | 1/2007 | Schwan et al. | 257/369 |
| 2007/0096195 A1 * | 5/2007 | Hoentschel et al. | 257/315 |
| 2007/0132038 A1 * | 6/2007 | Chong et al. | 257/401 |
| 2007/0202653 A1 * | 8/2007 | Hoentschel et al. | 438/301 |
| 2007/0235817 A1 * | 10/2007 | Wang et al. | 257/392 |
| 2007/0235823 A1 * | 10/2007 | Hsu et al. | 257/411 |

* cited by examiner

*Primary Examiner*—Zandra Smith
*Assistant Examiner*—Telly D Green
(74) *Attorney, Agent, or Firm*—Haynes and Boone, LLP (57) ABSTRACT

Provided is a semiconductor device including a substrate. A gate formed on the substrate. The gate includes a sidewall. A spacer formed on the substrate and adjacent the sidewall of the gate. The spacer has a substantially triangular geometry. A contact etch stop layer (CESL) is formed on the first gate and the first spacer. The thickness of the CESL to the width of the first spacer is between approximately 0.625 and 16.

20 Claims, 7 Drawing Sheets

TRIANGULAR SPACE ELEMENT FOR SEMICONDUCTOR DEVICE

BACKGROUND

The present disclosure relates generally to semiconductor devices and, more particularly, to a spacer element associated with a semiconductor device.

Conventional semiconductor device fabrication processes, such as used in the fabrication of MOSFET devices, utilize a technique of forming spacer elements (spacers). In MOSFET fabrication, spacers assist in the control and definition of the implantation of dopants in the source and drain regions of a device. In particular, spacers may be used to control and define a lightly-doped drain (LDD) region of a device. The LDD region allows for a more gradual transition from a drain and/or source region to the gate region and is therefore advantageous in that it reduces the electric field created and thereby mitigates short channel effects, reduces hot carrier generation, and increases junction breakdown voltage. To perform these functions, a spacer is typically formed coupled to, and/or abutting, the gate of a device. A spacer may also be useful in passivating a surface to which it is coupled, such as a gate electrode sidewall.

In a conventional process, a plurality of gates are often formed in close proximity on a substrate. The gates are formed such that there is a gap (space) between each gate. Each gate, and associated electrical contacts, require isolation from adjacent gate and/or contact structures in order to prevent, for example, contact-to-contact leakage. This isolation may be provided by an isolating layer (such as, an interlayer dielectric (ILD) layer), formed on the substrate. The isolating layer may fill the gap between the gates and/or surround the gate and contacts.

The typical conventional spacer is a D-shaped spacer, or a spacer having a geometry of a D-shape (rounded). D-shaped spacers, as well as other conventional spacer geometries, are disadvantageous in that they can cause voids in layers subsequently deposited over the spacers and gate elements, such as the isolating layer described above. As dimensions shrink with increasing technology demands, devices become more closely arranged on a semiconductor substrate. Consequently, the distance between the gates, the size of the gap between gates, shrinks. A smaller gap is more difficult to fill with subsequent layers of material, such as material that can isolate one device from another. The geometry of conventional spacers, such as the D-shaped spacers, provides a difficult reentrant profile (angle of entry) for the gap between the gates. This difficulty may cause the subsequent layers filling the gap to have voids in the region of the gap. These voids, if present in a layer such as a dielectric layer, may cause contact-to-contact leakage. These issues can be exacerbated as shallow trench isolation (STI) oxide loss becomes typical in the state of the art fabrication as recesses are formed in the STI oxide region due to the semiconductor processes after the STI formation. The STI loss regions may be difficult to fill using conventional geometry spacers. Thus, a spacer geometry that allows subsequent layers to more adequately fill the gap between gates is desired, for example, to reduce potential leakage.

Furthermore, conventional geometry spacers, such as D-shaped spacers, may cause cracks in layers formed on the spacers. For example, D-shaped spacers provide a high stress on subsequent layers. As technology progresses, the subsequent layers are required to be thinner, further exacerbating the stress on the layer. Thus, a spacer geometry that allows subsequent layers to have a lower stress environment is desired.

As such, an improved spacer geometry is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to semiconductor devices and more particularly, to spacer elements of a semiconductor device. It is understood, however, that specific embodiments are provided as examples to teach the broader inventive concept, and one of ordinary skill in the art can easily apply the teaching of the present disclosure to other methods or devices. For example, illustrated in the present disclosure is a spacer element associated with a device such as a MOSFET device. However, other devices are possible, for example, finFET or other multiple gate devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over, on, or coupled to a second feature in the description that follows may include embodiments in which the first and second features are formed in direct contact, and may also include embodiments in which additional features may be formed interposing the first and second features, such that the first and second features may not be in direct contact. Also, the formation of a feature on a substrate, or on a surface of a substrate, may include embodiments where features are formed above the surface of the substrate, adjacent to the surface of the substrate, directly on the surface of the substrate, and/or extending below the surface of the substrate (such as implanted regions).

Figure 1:
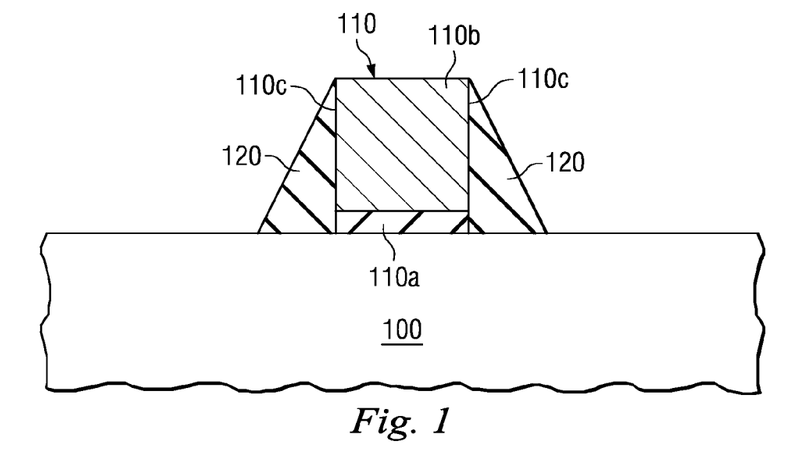
FIG. 1 is a cross-sectional view illustrating an embodiment of a substrate including a triangular spacer element.

Referring to FIG. 1, illustrated is a cross-sectional view of a portion of a device including a substrate 100. A gate electrode (gate) 110, including a gate dielectric layer 110a and a gate electrode 110b, and one or more spacer elements 120 are formed on the substrate 100. The gate 110 also comprises a pair of sidewalls 110c. The spacer element 120 is coupled to (e.g., abuts) the gate at each of the sidewalls 110c. In other embodiments, additional or fewer spacer elements may be associated with a gate. In an embodiment, the substrate 100 is silicon in a crystalline structure. In alternative embodiments, the substrate 100 may include other elementary semiconductors such as germanium, or includes a compound semiconductor such as, silicon carbide, gallium arsenide, indium arsenide, and indium phosphide. The substrate 100 may include a silicon on insulator (SOI) substrate. The gate dielectric layer 110a includes a dielectric material such as, silicon oxide, silicon nitride, silicon oxinitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate dielectric layer 110a may be formed using conventional processes such as, photolithography, oxidation, deposition, etching, and/or a variety of other processes known in the art. The gate electrode 110b includes conductive material. In an embodiment, the gate electrode includes polysilicon. In other embodiments, the gate may be a metal gate with the gate electrode 110b including a metal composition. Examples of suitable metals for forming the gate electrode 110b include Cu, W, Ti, Ta, TiN, TaN, NiSi, CoSi, and/or combinations thereof. The gate electrode layer 110b may be formed by conventional methods known in the art. For example, the gate electrode may be formed by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art followed by a photolithography and etching processes. The gate electrode 110b may further comprise a silicide layer, for example, for providing contact to an interconnect line (not shown). The silicide layer may include a silicide, such as nickel silicide, cobalt silicide, tungsten silicide, tantalum silicide, titanium silicide, platinum silicide, erbium silicide, palladium silicide, and/or combinations thereof.

The spacers 120 are formed as triangular geometry spacers (triangular shaped spacer). The spacers 120 are comprised of dielectric material that includes a selectively such that it can be etched to form a triangular geometry. In an embodiment, the spacers 120 are silicon nitride. Other embodiments may include spacers comprising silicon oxide, silicon carbide, silicon oxynitride, and/or combinations thereof. The spacers 120 may be formed by conventional processes known in the art such as deposition and etching, including wet etch processes and/or dry etch processes. The spacer material may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art. In an embodiment, the triangular geometry spacer is formed by a wet etch including $H_3PO_4$. In an alternative embodiment, the triangular geometry spacer is formed by a dry etch including F plasma. A conventional geometry spacer such as, a D-shaped spacer, may be formed and a wet etch or dry etch process performed to modify the geometry of the spacer to form a triangular shape. As such, a rounded profile spacer may be formed, which is then etched to provide a triangular profile.

In an embodiment, the spacers 120 include a liner between them and the gate. The liner may be comprised of silicon oxide. The liner may be formed by depositing oxide by a deposition process, such as PECVD, on the exposed surfaces of the substrate, gate dielectric layer, and gate electrode layer. The spacer material is then deposited on the liner layer.

Figure 2:
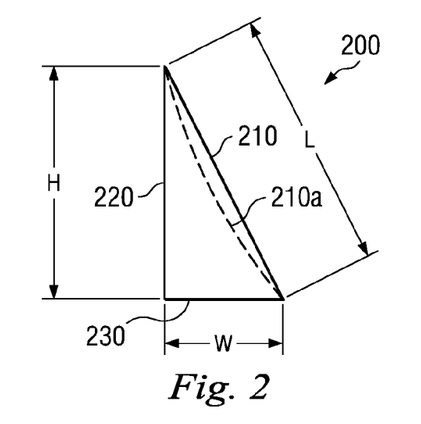
FIG. 2 is a cross-sectional view illustrating an embodiment of a triangular spacer element.

Referring now to FIG. 2, a triangular spacer 200 is shown to illustrate the triangular geometry of the spacer 120 (FIG. 1) in further detail. The triangular spacer 200 includes a geometry of a right triangle. The triangular spacer 200 may be substantially similar to the spacer 120, described above with reference to FIG. 1. The spacer 200 includes three sides: 210, 220, and 230. The side 230 defines the width W of the spacer 200 and may formed on a substrate, such as the substrate 100 described above with reference to FIG. 1, such that the side 230 is substantially parallel the surface of the substrate. The side 220 defines the height H of the spacer 200 and may be coupled to (abut) a gate, such as the gate including the gate electrode 110b, described above with reference to FIG. 1. The height of the gate may be substantially equal to the height H of the spacer 200. In an embodiment, a ratio of H over W is approximately equal to or greater than 1.6. In an embodiment, a ratio of H over W is approximately equal to or less than 20. In an embodiment, H is approximately 1000 A and W1 is between approximately 50 A and 600 A. In a further embodiment, the height of the gate electrode to which the spacer abuts is also approximately 1000 A.

The side 210 has a length L. In the illustrated embodiment, the triangular spacer 200 is approximately a right triangle. The length L may be approximately equal to the square root of the sum of $W^2$ and $H^2$. In an embodiment, the side 210 of the spacer 200 may be bowed, such that it is defined by reference line 210a. The bowing variation includes an offset from a substantially ideal triangle profile. The length of the side positioned at reference line 210a, a bowed side, is greater than L.

Figure 3A:
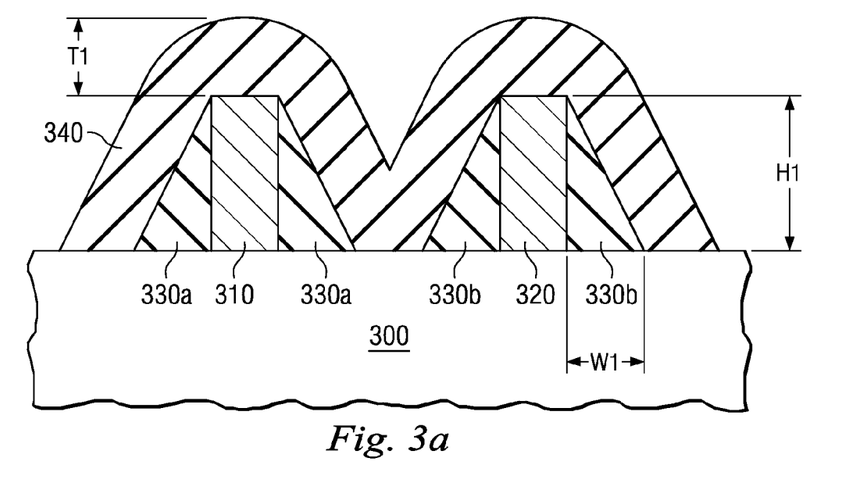
FIG. 3a is a cross-sectional view illustrating an embodiment of a substrate including a plurality of spacer elements.

Referring now to FIG. 3a, illustrated is a first gate electrode 310 and a second gate electrode 320 formed on a substrate 300. The substrate 300 and the gate electrodes 310 and 320 may be substantially similar to the substrate 100 and the gate electrode 110b respectively, both described above with reference to FIG. 1. The gate electrodes 310 and 320 have a height H1. Triangular spacers 330 are formed abutting the gate electrodes 310 and 320 respectively. The triangular spacers 330 may be substantially similar to the spacer 120 and/or the spacer 200, described above with reference to FIGS. 2 and 3 respectively. The height of the triangular spacers 330 is also approximately H1. However, embodiments where the triangular spacer 330 height varies from the gate electrode height H1 are possible. The triangular spacer 330 has a width W1. The width W1 may control the definition of a lightly doped drain (LDD) region associated with the gate electrodes 310 and/or 320. The height H1 and width W1 may be substantially similar to the height H and width W, described above with reference to FIG. 2.

A contact etch stop layer (CESL) 340 is formed on the substrate 300 including on the gate electrodes 310 and 320. In selecting the materials comprising the contact etch stop layer (CESL) 340, etching selectivity should be considered. Examples of materials that may be used to form CESL 340 includes silicon nitride, silicon oxide, silicon oxynitride, and/ or other materials known in the art. The CESL 340 may be formed by PECVD process and/or other deposition or oxidation processes known in the art. The CESL 340 may be a conformal layer. In an embodiment, the CESL 340 fills the gap between the gate electrode 310 and the gate electrode 320. In an alternative embodiment, various other layers may be used in conjunction with CESL 340 to fill the gap between the gate electrode 310 and the gate electrode 320. The CESL 340 may assist isolating the device including the gate electrode 310 from the device including the gate electrode 320.

The CESL 340 includes a thickness T1. In an embodiment, the ratio of T1 over W1 is greater than or equal to approximately 0.625. A ratio less than 0.625 may provide for device performance issues, as the thicker the CESL the better the device performance, see for example FIG. 3c, described in greater detail below. In an embodiment, the ratio of T1 over W1 is less than or equal to approximately 16. A higher aspect ratio, such as those ratios greater than 16, may create difficulties in filling a gap between gate electrode 310 and 320. As further example, in an embodiment, T1 is between approximately 250 A and 800 A and W1 is between approximately 50 A and 400 A. In an embodiment, the CESL 340 thickness T1 is approximately 550 A. The saturation current (Idsat) gain percentage of a device formed on the substrate 300 may be dependent on the CESL 340 thickness T1. For example, the Idsat gain percentage of the device including the gate electrode 310 may be dependent on the CESL 340 thickness T. FIG. 3c illustrates a graph 380 the Idsat gain in percentage (y-axis) versus the thickness of the CESL layer (x-axis). As illustrated by the graph 380, the greater the CESL thickness, the higher the device Idsat gain. For instance, a device having a CESL thickness of 600 A has an Idsat gain of approximately 3.5%. A device having a CESL thickness of 800 A has an Idsat gain of approximately 5.25%.

An interlayer dielectric (ILD) layer (not illustrated) may be deposited on the CESL 340. The ILD layer may assist to isolate the gate electrode 310 from the gate electrode 320, and further provide isolation between a contact associated with the gate electrode 310 from a contact associated with the gate electrode 320. The ILD layer may include dielectric materials such as, tetraethylorthosilicate (TEOS) oxide, un-doped silicon glass, or doped silicon oxide such as borophosphosilicate glass (BPSG), fused silica glass (FSG), phosphosilicate glass (PSG), boron doped silicon glass (BSG), and/or other materials known in the art. The ILD layer may be deposited by a high density plasmas CVD (HDPCVD) process and/or other deposition techniques known in the art.

The triangular spacers 330 may allow a larger open angle (reentrant profile) for subsequently formed layers, such as the CESL 340 and the ILD layer (not shown), to fill the gap between the gate electrodes 310 and 320, as compared to spacers having a conventional geometry. This open angle may provide for fewer voids in the formed layers. In an embodiment, for example in an 45 μm critical dimension process, the gates may be spaced such that a gap of approximately 1200 A exists between gate electrodes. This gap may be filled by a CESL and/or ILD layer.

The substrate 300 may include active areas (oxide definition or OD areas) and isolation regions. In an embodiment, the triangular spacers 330a and 300b and the gate structures 310 and 320 are formed on an OD area of the substrate 300. The triangular spacers in the OD area may define a portion of the substrate 300 that is doped, such as the width of the triangular spacer may define the lightly doped drain region. In an alternative embodiment, the triangular spacers may be positioned on the isolation region of the substrate, as illustrated in greater detail below with reference to FIG. 4a.

Figure 3B:
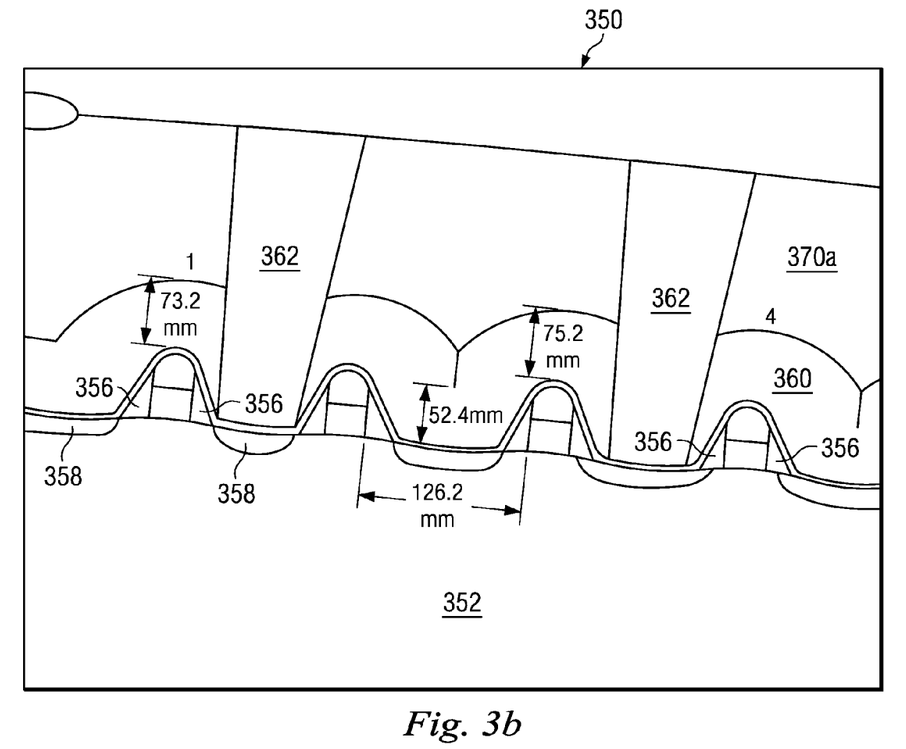
FIG. 3b is a photograph representing a similar embodiment of a substrate including a plurality of spacer elements.
Figure 3C:
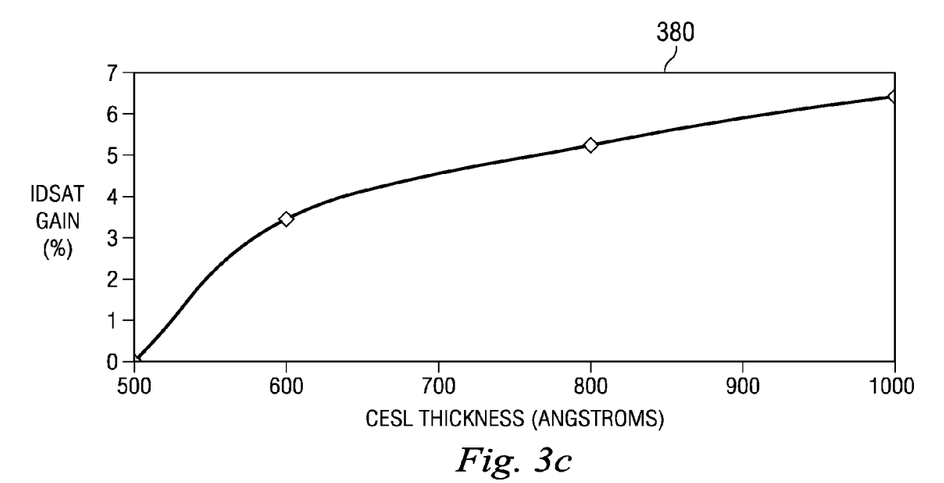
FIG. 3c is a graph illustrating an embodiment of a device performance parameter versus a layer thickness.

Referring now to FIG. 3b, illustrated is a photograph of a cross-section of a device 350. The device 350 includes a substrate 352, and a plurality of gate structures 354 formed on the substrate 352. The substrate 352 includes an active area on which the gate structures 354 are formed. The substrate 352 and the gate structures 354 may be substantially similar to the substrate 300 and the gate electrodes 310 and 320, described above with reference to FIG. 3a. Formed adjacent and coupled to the sidewall of the gate structures 354 are triangular-shaped spacers 356. The spacers 356 may be substantially similar to the spacers 330a and/or 330b also described above with reference to FIG. 3a. A plurality of implanted regions 358 are formed in the substrate 352; the implanted regions 358 may include for example, a LDD, source, and/or drain region. A conformal layer 360 is formed on the gate electrodes 354 and spacers 356. The conformal layer 360 may be substantially similar to the CESL 340, also described above with reference to FIG. 3a. A pair of contact vias 362 provide contact to the substrate 352 and in particular to an implanted region 358. The contact vias 362 may comprise copper, aluminum, tungsten, tantalum, titanium, nickel, cobalt, metal silicide, metal nitride, poly silicon, and/or other materials possibly including one or more refractory layers or linings, and may be formed by CVD, PVD, ALD, plating, and/or other processes known in the art.

Figure 4A:
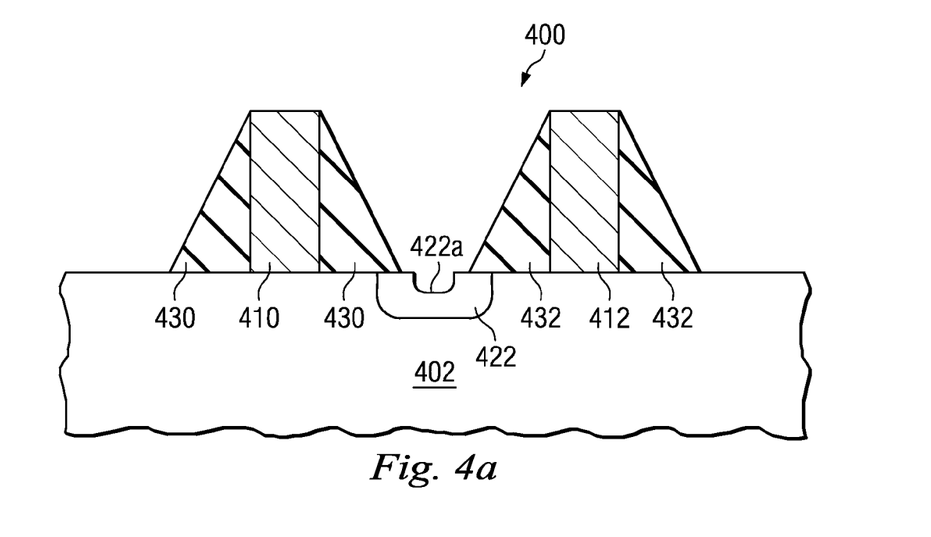
FIG. 4a is a cross-sectional view illustrating an embodiment of a substrate including a plurality of spacer elements.

Referring now to FIG. 4a, illustrated is a plurality of gate electrodes 410 and 412 formed on a substrate 400. The gate electrodes 410 and 412 may be substantially similar to the gate 110, described above with reference to FIG. 1. The substrate 400 includes an isolation region 402. The substrate 400 may further include an active region (not shown) (oxide definition (OD) region), as described above. The substrate 400 may be substantially similar to the substrate 100, described above with reference to FIG. 1. In the isolation region 402, shallow trench isolation (STI) structure 422 is formed. The STI structure 422 may be formed by etching apertures in the substrate 400 using conventional processes such as reactive ion etch (RIE) after photolithography patterning. The apertures may then be filled with an insulator material, such as an oxide. In an embodiment, the process includes conformal low-pressure chemical vapor deposition (LPCVD) of oxide to fill an aperture, and continues with a chemical-mechanical polish (CMP) process to planarize the oxide. The STI structure 422 includes a recess, designated 422a, wherein the oxide has been removed. This may be termed STI oxide loss as known in the art. The recess 422a is formed by wet etch processes. The STI loss including recess 422a provides for difficult reentrant profile for later processes providing isolation between adjacent devices.

Additional layers (not shown) may be formed on the substrate 400 and may fill the gap between the gate electrode 410 and 412. The additional layer(s) may also fill the STI loss region (recess) 422a. In an embodiment, a contact etch stop layer (CESL) may be formed on the substrate 400 and fill the gap between the gate electrode 410 and the gate electrode 412. In a further embodiment, a CESL and a dielectric layer, such as an ILD layer, may fill the gap between the gate electrode 410 and the gate electrode 412. The CESL and/or the ILD layer may fill the STI recess 422a.

Figure 4B:
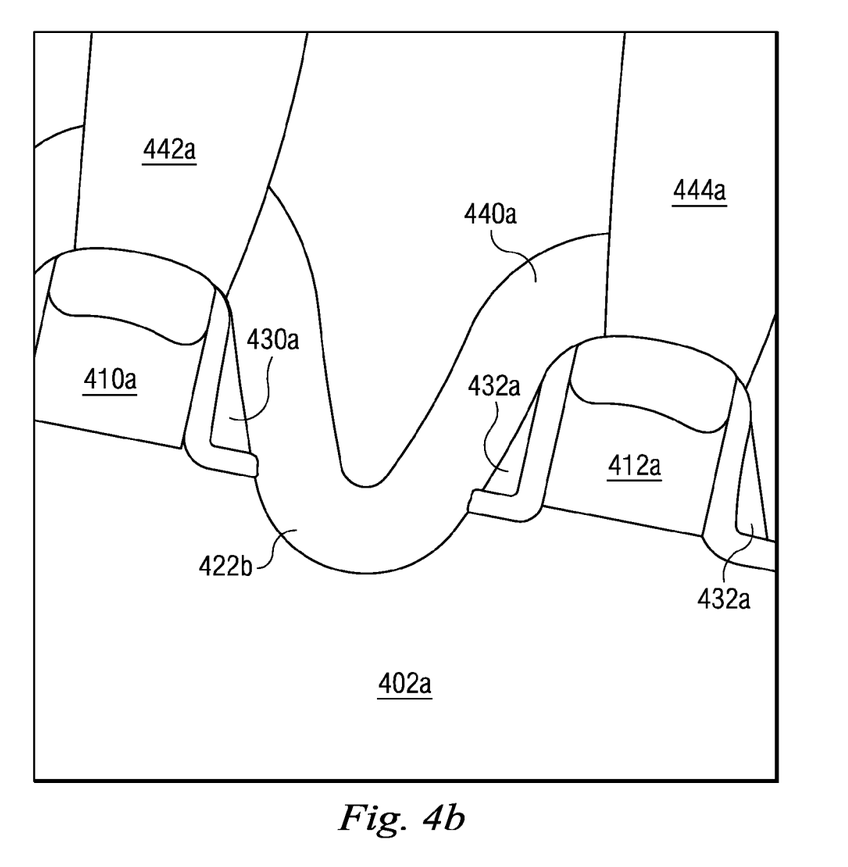
FIG. 4b is a photograph representing a similar embodiment of a substrate including a plurality of spacer elements.

Referring now to FIG. 4b, illustrated is a first gate electrode 410a and a second gate electrode 412a formed on an isolation region of a substrate 402a. Triangular shaped spacers 430a and 432a are formed adjacent the first and second gate electrode 410a and 412a respectively. The substrate 402a, the gate electrodes 410a and the spacers 430a, 432a may all be substantially similar to the substrate 402, gate electrodes 410 and 412, and the spacers 430 and 432, respectively, all described above with reference to FIG. 4a. A conformal layer 440a is formed on and between the gate structures 410a and its spacer 430a and the gate 412a and its spacer 432a. The conformal layer 440a may be substantially similar to the etch stop layer 340, described above with reference to FIG. 3a. The conformal layer 440a also fills a recess 422b in the substrate 402a. The recess 422b may be an STI oxide loss region, and may be substantially similar to the recess 422a described above with reference to FIG. 4a. A pair of contacts 442a and 444a provide electrical contact to the gate structures 410a and 412a respectively. The contacts 442a and 444a may include copper, aluminum, tungsten, tantalum, titanium, nickel, cobalt, metal silicide, metal nitride, poly silicon, and/or other materials possibly including one or more refractory layers or linings, and may be formed by CVD, PVD, ALD, plating, and/or other processes.

Figure 5:
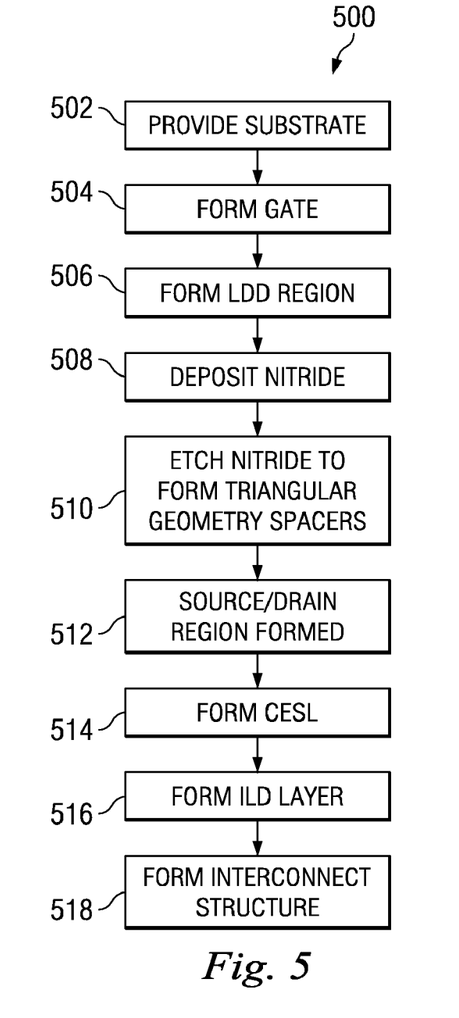
FIG. 5 is a flow chart illustrating an embodiment of a method of fabricating a device including a triangular spacer element.
Figure 6A:
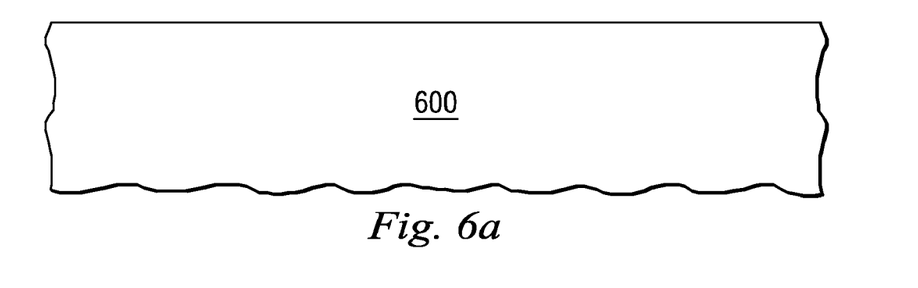
FIGS. 6a, 6b, 6c, 6d, 6e, 6f, 6g, and 6h are cross-sectional views illustrating an embodiment of the fabrication of a device according to the method of FIG. 5.
Figure 6B:
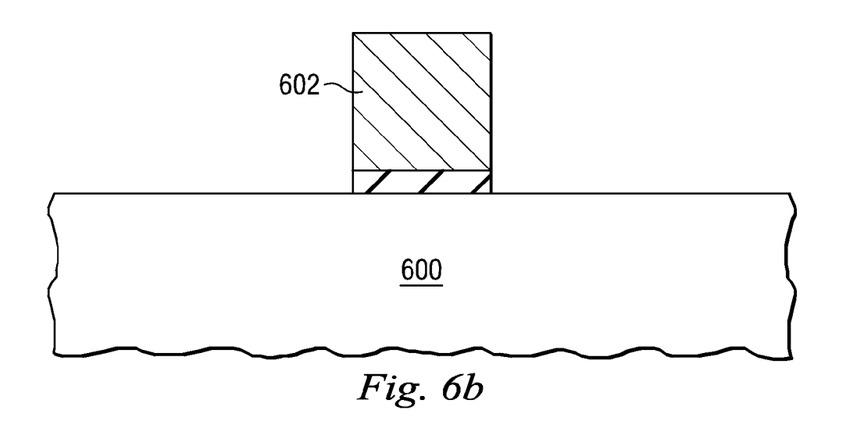
Figure 6C:
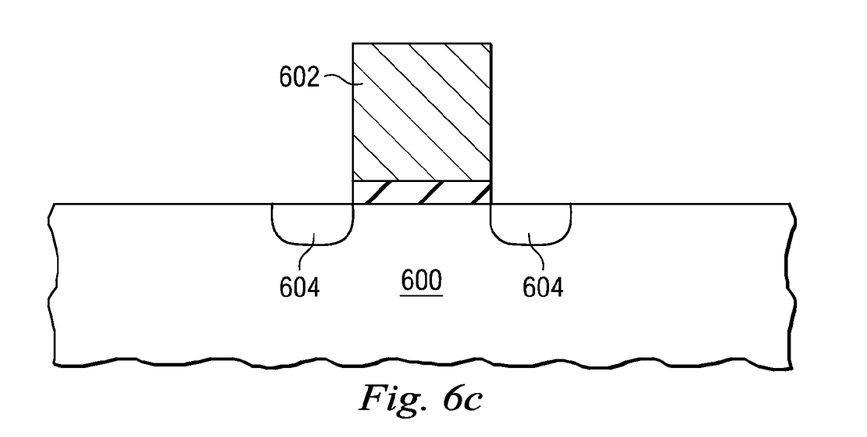
Figure 6D:
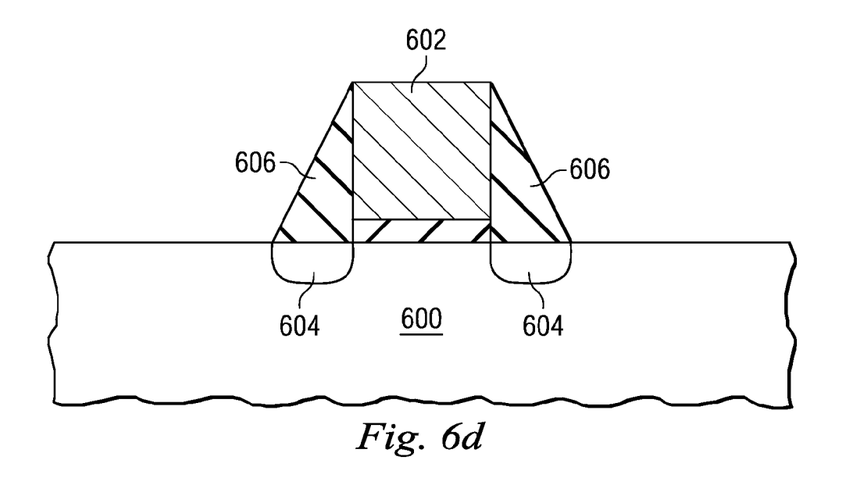
Figure 6E:
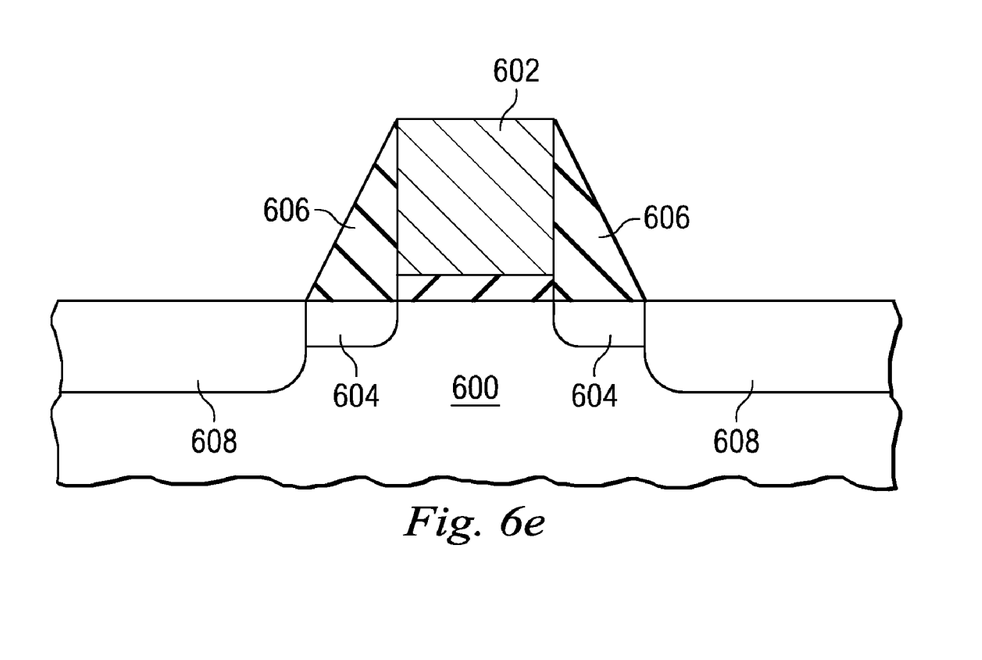
Figure 6F:
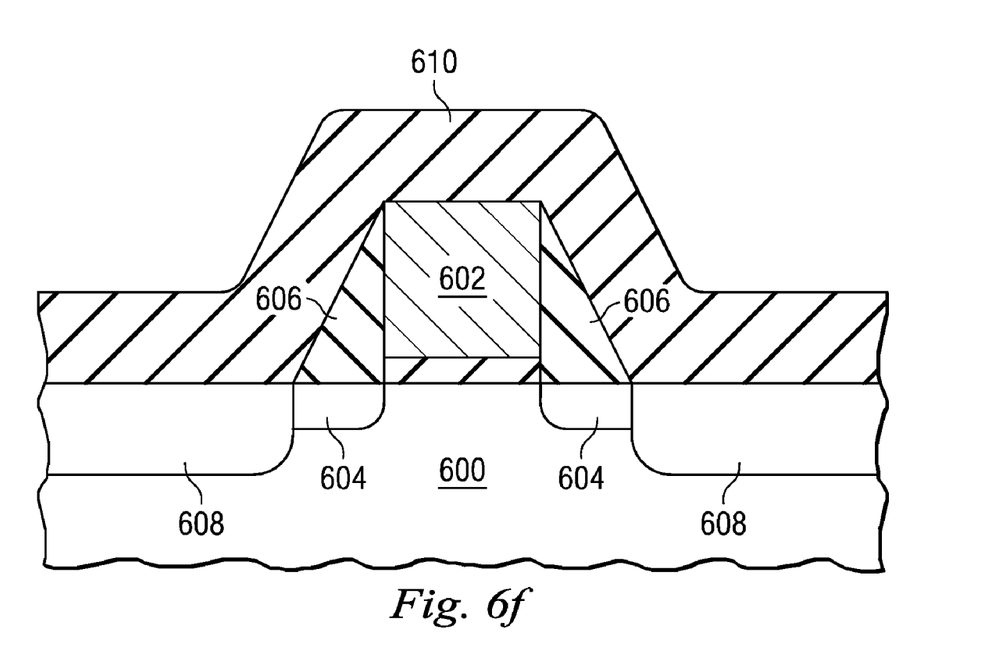
Figure 6G:
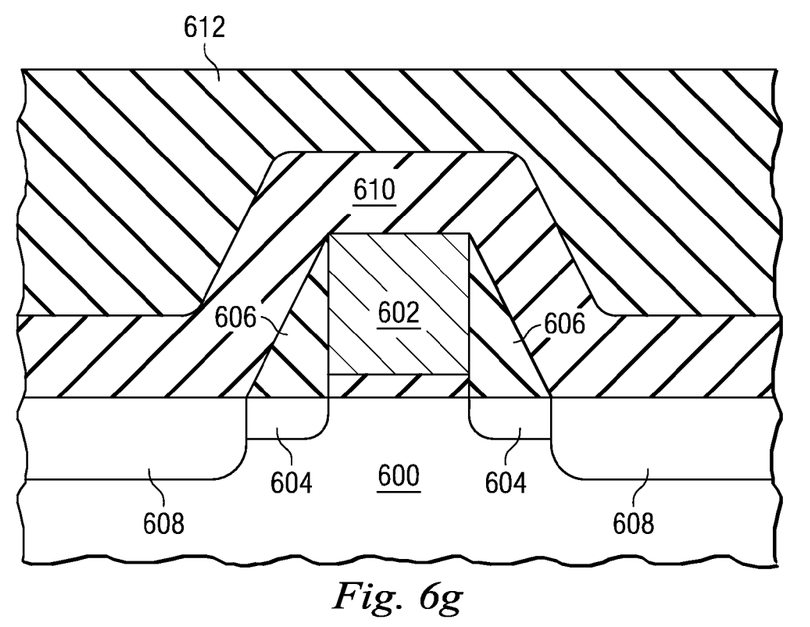
Figure 6H:
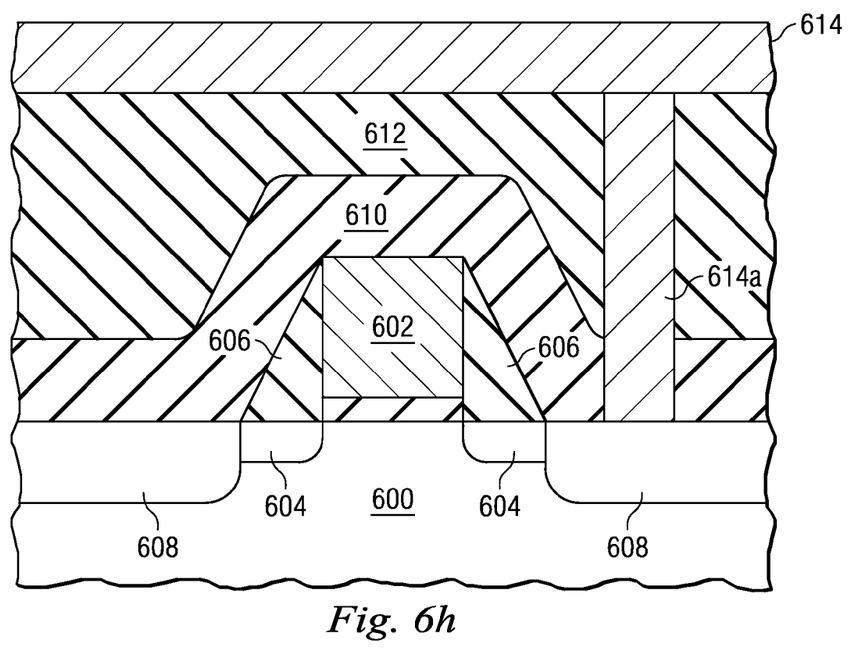

Referring now to FIG. 5, illustrated is a method 500 for forming a semiconductor device including triangular geometry spacer elements. FIGS. 6a, 6b, 6c, 6d, 6e, 6f, 6g, and 6h illustrate incremental modifications of a substrate 600 that correspond to the steps of FIG. 5. The method 500 begins at step 502 where a substrate is provided. The substrate provided may be substantially similar to the substrate 100, described above in reference to FIG. 1. The substrate may include isolation regions, substantially similar to the substrate 400, described above with reference to FIG. 4. Referring to the example of FIG. 6a, the substrate 600 is provided. The substrate 600 includes an OD (active) region. The substrate 600 may be silicon in a crystalline structure and/or include other elementary semiconductors such as germanium, or compound semiconductor such as, silicon carbide, gallium arsenide, indium arsenide, and indium phosphide. The method 500 continues to step 504 where a gate is formed on the substrate. The gate includes a gate dielectric and a gate electrode. The gate dielectric layer and the gate electrode may be substantially similar to the gate dielectric layer 110a and the gate electrode 110b respectively, described above with reference to FIG. 1. In an embodiment, a plurality of gates are formed on the substrate adjacent to one another, such that a gap is formed between the gates. For example, in a 45 μm critical dimension process, the gates may be spaced such that a gap of approximately 1200 Å exists between gate electrodes. Referring to the example of FIG. 6b, the gate structure 602 is formed on the substrate 600. The method 500 then continues to step 506 where a lightly doped drain (LDD) region may be formed. The LDD region may be formed using photolithography patterning, ion implantation, diffusion, and/or other processes known in the art. The LDD region may include an area with a conductivity different than the substrate. For example, the substrate may be a P-type conductivity and the LDD region N-type, or vice versa. Referring to the example of FIG. 6c, the lightly doped drain (LDD) region 604 are formed in the substrate 600.

The method 500 proceeds to steps 508 and 510 where a spacer material of silicon nitride is deposited on the substrate and etched to form a triangular geometry spacer. The spacer material includes a material having a selectivity such that it may be appropriately etched into a triangular geometry spacer. In alternative embodiments of the method 500, the spacer material may include other materials such as silicon oxide, silicon carbide, silicon oxynitride, and/or combinations thereof. The spacer material layer may be formed by oxidation, physical vapor deposition, chemical vapor deposition (CVD), plasma-enhanced CVD, atmospheric pressure CVD, low-pressure CVD, high-density plasma CVD, atomic layer CVD, and/or other processes known in the art. The method 600 proceeds to step 610 where the spacer's triangular geometry is formed. The deposited spacer material is shaped into a triangular geometry spacer. The spacer shape may be substantially similar to that of the spacer 200, described above with reference to FIG. 2. In an embodiment, the spacer material may be etched using a wet etch process. The wet etch process may include a chemical such as $H_3PO_4$. In an alternative embodiment, the spacer material may be etched using a dry etch process. The dry etch process may include an F plasma etchant. In an embodiment, a conventional geometry spacer, such as a D-shaped spacer, may be formed and a second etch process, including a wet etch or a dry etch, may be performed to modify the D-shaped geometry into a triangular geometry. Referring to the example of FIG. 6d, the triangular-geometry spacers 606 are formed abutting the sidewall of the gate structure 602.

The method 500 then proceeds to step 512 where the source and/or drain region is formed. The source and/or drain region may be formed using processes known in the art such as photolithography, ion implantation, and/or diffusion. The source/drain region may include a region with a conductivity opposite that of the substrate, for example a p-type substrate and an n-type source/drain, or vice versa. In an embodiment, the spacer formed may mask the LDD region formed above in step 506 from further doping. Referring to the example of FIG. 6e, the source/drain regions 608 are formed in the substrate 600. Though illustrated as separate sections, the LDD region 604 and the source/drain regions 608 may overlap. The source/drain region 608 may include a silicide layer (not shown).

The method 500 proceeds to step 514 where a contact etch stop layer (CESL) is formed on the substrate. Prior to the formation of the CESL and after the formation of the spacers, a layer of silicide may be formed on the source, drain, and/or gate electrode. The CESL may be formed on and/or over the gate and spacers, such as is illustrated in FIG. 3a. The CESL may be substantially similar to the CESL 340, described above in reference to FIG. 3a. The ratio of the CESL layer thickness to the spacer width may be between approximately 0.625 and 16. Referring to the example of FIG. 6f, the CESL 610 is formed on the substrate 600, including on and over the gate structure 602 and the spacers 606.

The method 500 then proceeds to step 516 where an interlayer dielectric layer (ILD layer) is formed on the substrate including on the CESL. The ILD layer may include dielectric materials such as, tetraethylorthosilicate (TEOS) oxide, undoped silicon glass, or doped silicon oxide such as borophosphosilicate glass (BPSG), FSG, PSG, BSG, and/or other materials known in the art. The ILD layer may be deposited by high density plasma CVD (HDPCVD) method or other deposition techniques known in the art. The ILD layer and/or the CESL may provide isolation between devices, including gate electrodes and/or contacts, on the substrate. Referring to the example of FIG. 6g, the ILD layer 612 is deposited on the substrate 600, and overlying the CESL 610.

The method 500 proceeds to step 518 where an interconnect structure is formed. The interconnect structure may include vias (e.g. vertical interconnects) providing contacts to the source, drain, and/or gate electrode, as well as interconnect lines. The interconnect vias and/or lines may comprise copper, aluminum, tungsten, tantalum, titanium, nickel, cobalt, metal silicide, metal nitride, poly silicon, and/or other conductive materials possibly including one or more refractory layers or linings, and may be formed by CVD, PVD, ALD, plating, and/or other processes known in the art. Referring to the example of FIG. 6h, the interconnect structure 614, including via 614a, is formed on the substrate 600. The contact etch stop layer 610 may be used to etch the via 614a to provide contact to the source/drain region 608. The ILD layer 612 and/or the CESL 610 may provide isolation of the interconnect structure, including via 614a, from other devices on the substrate 600.

The embodiment of method 500 is exemplary only and not intended to be limiting. Other methods are possible. For example, in a method for forming triangular spacers, the source/drain implant (e.g. heavy doping) may be performed prior to the LDD implant for example. As further example, one or more of the steps described above in the method 500 may be omitted, such as, step 506 in creating a device that does not require a LDD or step 516 forming the ILD layer when the CESL may be operable to provide isolation between devices. The method 500 may also include additional steps known in the art. In an embodiment of the method 500, a triangular spacer may be formed after a silicide is formed on the gate electrode of the gate structure and prior to depositing the contact etch stop layer (CESL). As a further example, a liner layer for the spacer may be formed prior to deposition of the spacer material in step 508.

Thus provided is a semiconductor device including a substrate. A first gate formed on the substrate. The first gate includes a sidewall. A first spacer is formed on the substrate. The first spacer is adjacent the sidewall of the first gate. The first spacer has a substantially triangular geometry. In an embodiment, a contact etch stop layer (CESL) formed on the first gate and the first spacer. In a further embodiment, the first spacer has a width and the CESL has a thickness. The ratio of CESL thickness to first spacer width is between approximately 0.625 and 16.

Also provided is a semiconductor device including a substrate. A plurality of gate electrodes, a plurality of triangular shaped spacer elements, and a conformal layer are formed on the substrate. At least one of the plurality of triangular geometry spacer elements abuts at least one of the plurality of gate electrodes. The triangular geometry spacer element has a width. The width defines a doped region on the substrate. The conformal layer is formed over the plurality of gate electrodes and the plurality of triangular geometry spacer elements. The conformal layer has a thickness that is approximately 0.625 to 16 times the width of the triangular geometry spacer element.

Further provided is a method of forming a semiconductor device. A substrate is provided. A first gate electrode and a second gate electrode are formed on the substrate. A spacer material is deposited on the substrate, including adjacent the first gate electrode and the second gate electrode. The spacer material is etched to form a triangle shaped spacer. An etch stop layer is deposited on the substrate. The etch stop layer has a thickness between 0.625 and 16 times the width of the triangular geometry spacer.

Although only a few exemplary embodiments of this invention have been described in detail above, those skilled in the art will readily appreciate that many modifications are possible in the exemplary embodiments without material departing from the novel teachings and advantages of this disclosure.

What is claimed is:

1. A semiconductor device, comprising:
 a substrate;
 a first gate formed on the substrate, the first gate including a sidewall;
 a first spacer having a width formed on the substrate and adjacent to the sidewall of the first gate, the first spacer having a substantially triangular geometry;
 a contact etch stop layer (CESL) having a thickness formed on the first gate and the first spacer, wherein the ratio of the thickness of the CESL to the width of the first spacer is between approximately 0.625 and 16.

2. The device of claim 1, wherein the first spacer has a height, and wherein the ratio of the height of the first spacer to the width of the first spacer is between approximately 1.6 and 20.

3. The device of claim 1, wherein the first spacer comprises silicon nitride.

4. The device of claim 1, further comprising:
 a second gate formed on the substrate at a distance from the first gate such that a gap between the second gate and the first gate is formed; and
 a second triangular geometry spacer coupled to the second gate.

5. The device of claim 4, wherein the CESL at least partially fills the gap between the second gate and the first gate.

6. The device of claim 4, further comprising:
 a layer of insulating material formed on the substrate, wherein the layer fills at least a portion of the gap between the second gate and the first gate.

7. The device of claim 1, wherein the first spacer having a substantially triangular geometry includes a spacer having a width between approximately 50 A and 400 A.

8. The device of claim 1, wherein the first spacer is formed on an isolation region of the substrate.

9. The device of claim 8, wherein the isolation region of the substrate includes shallow trench isolation (STI) structure comprising oxide, wherein the STI structure has a recess wherein the oxide has been removed.

10. The device of claim 9, wherein the CESL fills at least a portion of the recess.

11. A semiconductor device comprising:
 a substrate;
 a plurality of gate electrodes formed on the substrate;
 a plurality of triangular geometry spacer elements formed on the substrate, wherein at least one of the plurality of triangular geometry spacer elements abuts at least one of the plurality of gate electrodes, and wherein the at least one triangular geometry spacer element has a width, the width defining a doped region on the substrate; and
 a conformal layer formed on the substrate over the plurality of gate electrodes and the plurality of triangular geometry spacer elements, wherein the conformal layer has a thickness that is approximately 0.625 to 16 times the width of the at least one triangular geometry spacer element.

12. The device of claim 11, wherein the conformal layer provides isolation between the plurality of gate electrodes.

13. The device of claim 11, wherein the conformal layer includes an etch stop layer.

14. The device of claim 11, wherein the at least one triangular geometry spacer element has a height, and wherein a ratio of the height of the at least one triangular spacer to the width of the at least one triangular spacer is between approximately 1.6 and 20.

15. A semiconductor device comprising:
 a substrate;
 a first gate electrode and a second gate electrode formed on the substrate; and
 a first and a second triangular geometry spacer element formed on the substrate abutting the first gate electrode, wherein the first triangular geometry spacer element and the second triangular geometry spacer element each have a first surface abutting the first gate electrode having a length h, a second surface abutting the semiconductor substrate having a length w, and a third surface extending between the first surface and the second surface having a length L, wherein L is approximately equal to the square root of the sum of $w^2$ and $h^2$.

16. The semiconductor device of claim 15, further comprising:
a third and a fourth triangular geometry spacer element formed on the substrate abutting the second gate electrode, wherein the third triangular geometry spacer element and the fourth triangular geometry spacer element each have a first surface abutting the second gate electrode having a length h, a second surface abutting the semiconductor substrate having a length w, and a third surface extending between the first surface and the second surface having a length L, wherein L is approximately equal to the square root of the sum of $w^2$ and $h^2$.

17. The semiconductor device of claim 15, further comprising:
a shallow trench isolation (STI) feature formed on the substrate between the first gate electrode and the second gate electrode.

18. The semiconductor device of claim 15, further comprising:
a conformal layer formed over the first and second gate electrode.

19. The semiconductor device of claim 18, wherein the conformal layer is a contact etch stop layer.

20. The semiconductor device of claim 18, wherein the conformal layer is an interlayer dielectric (ILD) layer.

* * * * *